(12) United States Patent
Daga

(10) Patent No.: US 8,576,631 B2
(45) Date of Patent: Nov. 5, 2013

(54) TECHNIQUES FOR SENSING A SEMICONDUCTOR MEMORY DEVICE

(75) Inventor: Jean-Michel Daga, Peynier (FR)

(73) Assignee: Micron Technology, Inc., Boise, ID (US)

( * ) Notice: Subject to any disclaimer, the term of this patent is extended or adjusted under 35 U.S.C. 154(b) by 302 days.

(21) Appl. No.: 13/037,662

(22) Filed: Mar. 1, 2011

(65) Prior Publication Data

US 2011/0216617 A1    Sep. 8, 2011

Related U.S. Application Data

(60) Provisional application No. 61/310,509, filed on Mar. 4, 2010.

(51) Int. Cl.
*G11C 11/34* (2006.01)

(52) U.S. Cl.
USPC ....... 365/185.21; 365/196; 365/205; 365/207

(58) Field of Classification Search
USPC .............................. 365/185.21, 196, 205, 207
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |
| 4,658,377 A | 4/1987 | McElroy | |
| 4,791,610 A | 12/1988 | Takemae | |
| 4,807,195 A | 2/1989 | Busch et al. | |
| 4,954,989 A | 9/1990 | Auberton-Herve et al. | |
| 4,979,014 A | 12/1990 | Hieda et al. | |
| 5,010,524 A | 4/1991 | Fifield et al. | |
| 5,144,390 A | 9/1992 | Matloubian | |
| 5,164,805 A | 11/1992 | Lee | |
| 5,258,635 A | 11/1993 | Nitayama et al. | |

(Continued)

FOREIGN PATENT DOCUMENTS

| CA | 272437 | 7/1927 |
|---|---|---|
| EP | 0 030 856 | 6/1981 |

(Continued)

OTHER PUBLICATIONS

Arimoto et al., A Configurable Enhanced T2RAM Macro for System-Level Power Management Unified Memory, 2006, VLSI Symposium.

(Continued)

*Primary Examiner* — Jason Lappas

(74) *Attorney, Agent, or Firm* — Wilmer Cutler Pickering Hale and Dorr LLP

(57) ABSTRACT

Techniques for sensing a semiconductor memory device are disclosed. In one particular exemplary embodiment, the technique(s) may be realized as a semiconductor memory device comprising a plurality of memory cells arranged in an array of rows and columns and data sense amplifier circuitry coupled to at least one of the plurality of memory cells. The data sense amplifier circuitry may comprise first amplifier circuitry and resistive circuitry, wherein the first amplifier circuitry and the resistive circuitry may form a feedback loop.

19 Claims, 7 Drawing Sheets

(56) References Cited

U.S. PATENT DOCUMENTS

| | | |
|---|---|---|
| 5,313,432 A | 5/1994 | Lin et al. |
| 5,315,541 A | 5/1994 | Harari et al. |
| 5,350,938 A | 9/1994 | Matsukawa et al. |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidaka et al. |
| 6,048,756 A | 4/2000 | Lee et al. |
| 6,081,443 A | 6/2000 | Morishita et al. |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakrauni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portman et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi et al. |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |

(56) References Cited

U.S. PATENT DOCUMENTS

| | | | |
|---|---|---|---|
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,545,695 B2 * | 6/2009 | Koike ......................... 365/207 |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |

(56) References Cited

FOREIGN PATENT DOCUMENTS

| | | |
|---|---|---|
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | 04-176163 A | 6/1922 |
| JP | 62-007149 A | 1/1987 |
| JP | 62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | 08-213624 A | 8/1996 |
| JP | 08-274277 | 10/1996 |
| JP | 08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto, A High-Density Scalable Twin Transistor RAM (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06, International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. On El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multifunctional SoC Applications, Dec. 2008, IEDM.

Clarke, Junctionless Transistors Could Simply Chip Making, Say Researchers, EE Times, Feb. 2010, www.eetimes.com/showArticle.jhtml?articleID=223100050.

Colinge, J.P., "An SOI voltage-controlled bipolar-MOS device", IEEE Transactions on Electron Devices, vol. ED-34, No. 4, Apr. 1987, pp. 845-849.

Colinge, Nanowire Transistors Without Junctions, Nature NanoTechnology, vol. 5, 2010, pp. 225-229.

Collaert et al., Optimizing the Readout Bias for the Capacitorless 1T Bulk FinFET RAM Cell, 2009, IEEE EDL.

Collaert, Comparison of scaled floating body RAM architectures, Oct. 2008, SOI Conference.

Ershov, Optimization of Substrate Doping for Back-Gate Control in SOI T-RAM Memory Technology, 2005, SOI Conference.

(56) References Cited

OTHER PUBLICATIONS

Ertosun et al., A Highly Scalable Capacitorless Double Gate Quantum Well Single Transistor DRAM: 1T-QW DRAM, 2008, IEEE EDL.

Fazan et al., "A Simple 1-Transistor Capacitor-Less Memory Cell for High Performance Embedded DRAMs", IEEE 2002 Custom Integrated Circuits Conference, Jun. 2002, pp. 99-102.

Fazan, A Highly Manufacturable Capacitor-less 1T-DRAM Concept, 2002, SPIE.

Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).

Fisch, Beffa, Bassin, Soft Error Performance of Z-RAM Floating Body Memory, 2006, SOI Conference.

Fisch, Carman, Customizing SOI Floating Body Memory Architecture for System Performance and Lower Cost, 2006, SAME.

Fisch, Z-RAM® Ultra-Dense Memory for 90nm and Below, 2006, Hot Chips.

Fossum et al., New Insights on Capacitorless Floating Body DRAM Cells, 2007, IEEE EDL.

Fujita, Array Architectureof Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.

Han et al., Bulk FinFET Unified-RAM (URAM) Cell for Multifunctioning NVM and Capacitorless 1T-DRAM, 2008, IEEE EDL.

Han et al., Partially Depleted SONOS FinFET for Unified RAM (URAM) Unified Function for High-Speed 1T DRAM and Nonvolatile Memory, 2008, IEEE EDL.

Han, Energy Band Engineered Unified-RAM (URAM) for Multi-Functioning 1T-DRAM and NVM, Dec. 2008, IEDM.

Han, Parasitic BJT Read Method for High-Performance Capacitorless 1T-DRAM Mode in Unified RAM, Oct. 2009, IEEE EDL.

Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. On El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Gigabit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI FLASH Memory Cell", IEEE, Mar. 2000, pp. 12-15.

Liu et al., Surface Generation-Recombination Processes of Gate and STI Oxide Interfaces Responsible for Junction Leakage on SOI, Sep. 2009, ECS Transactions, vol. 25.

Liu, Surface Recombination-Generation Processes of Gate, STI and Buried Oxide Interfaces, Responsible for Junction Leakage, ICSI, May 19, 2009.

Lončar et al., "One of Application of SOI Memory Cell—Memory Array", IEEE Proc. 22nd International Conference on Microelectronics (MIEL 2000), vol. 2, NIS, Serbia, May 14-17, 2000, pp. 455-458.

Lu et al., A Novel Two-Transistor Floating Body/Gate Cell for Low Power Nanoscale Embedded DRAM, 2008, IEEE Trans. On El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1TBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMO Devices, Oct. 2009, SOI conference.

Morishita, A Capacitorless Twin-Transistor Random Access Memory (TTRAM) on SOI, 2005, CICC.

Morishita, F. et al., "A Configurable Enhanced TTRAM Macro for System-Level Power Management Unified Memory", IEEE Journal of Solid -State Circuits, vol. 42, No. 4, pp. 853, Apr. 2007.

(56) References Cited

OTHER PUBLICATIONS

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying of Hot Carrier Effect in Floating Body Soi Mosfets by the Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.562µm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-ONO (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitor-less DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less Dram Memory, SOI Conference, 2009 IEEE International, Oct. 5-8, 2009 pp. 1-2.

Roy, Thyristor-Based Volatile Memory in Nano-Scale CMOS, 2006, ISSCC.

Salling et al., Reliability of Thyristor Based Memory Cells, 2009, IRPS.

Sasaki et al., Charge Pumping in SOS-MOS Transistors, 1981, IEEE Trans. On El. Dev.

Sasaki et al., Charge Pumping SOS-MOS Transistor Memory, 1978, IEDM.

Schloesser et al., "A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. On El. Dev.

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm BOX Structure for Embedded DRAM Applications, 2004, VLSI Symposium.

Sim et al., "Source-Bias Dependent Charge Accumulation in P+ –Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

(56) References Cited

OTHER PUBLICATIONS

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanabe et al., A 30-ns. 64-MB DRAM with Built-in-Self-Test and Self-Repair Function, IEEE Journal of Solid State Circuits, vol. 27, No. 11, Nov. 1992, pp. 1525-1533.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15 µm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. On El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

\* cited by examiner

TECHNIQUES FOR SENSING A SEMICONDUCTOR MEMORY DEVICE

CROSS-REFERENCE TO RELATED APPLICATIONS

This patent application claims priority to U.S. Provisional Patent Application No. 61/310,509, filed Mar. 4, 2010, which is hereby incorporated by reference herein in its entirety.

FIELD OF THE DISCLOSURE

The present disclosure relates generally to semiconductor memory devices and, more particularly, to techniques for sensing a semiconductor memory device.

BACKGROUND OF THE DISCLOSURE

The semiconductor industry has experienced technological advances that have permitted increases in density and/or complexity of semiconductor memory devices. Also, the technological advances have allowed decreases in power consumption and package sizes of various types of semiconductor memory devices. There is a continuing trend to employ and/or fabricate advanced semiconductor memory devices using techniques, materials, and devices that improve performance, reduce leakage current, and enhance overall scaling. Silicon-on-insulator (SOI) and bulk substrates are examples of materials that may be used to fabricate such semiconductor memory devices. Such semiconductor memory devices may include, for example, partially depleted (PD) devices, fully depleted (FD) devices, multiple gate devices (e.g., double, triple gate, or surrounding gate), and Fin-FET devices.

A semiconductor memory device may include a memory cell having a memory transistor with an electrically floating body region wherein electrical charge may be stored. When excess majority electrical charges carriers are stored in the electrically floating body region, the memory cell may store a logic high (e.g., binary "1" data state). When the electrical floating body region is depleted of majority electrical charge carriers, the memory cell may store a logic low (e.g., binary "0" data state). Also, a semiconductor memory device may be fabricated on silicon-on-insulator (SOI) substrates or bulk substrates (e.g., enabling body isolation). For example, a semiconductor memory device may be fabricated as a three-dimensional (3-D) device (e.g., a multiple gate device, a Fin-FET device, and a vertical pillar device).

In one conventional technique, the memory cell of the semiconductor memory device may be read by applying bias signals to a source/drain region and a gate of the memory transistor. As such, a conventional reading technique may involve sensing an amount of current provided/generated by/in the electrically floating body region of the memory cell in response to the application of the source/drain region and gate bias signals to determine a data state of the memory cell. For example, the memory cell may have two or more different current states corresponding to two or more different logical states (e.g., two different current conditions/states corresponding to two different logic states: a binary "0" data state and a binary "1" data state).

In another conventional technique, the memory cell of the semiconductor memory device may be written to by applying bias signals to the source/drain region(s) and the gate of the memory transistor. As such, a conventional writing technique may result in an increase/decrease of majority charge carriers in the electrically floating body region of the memory cell which, in turn, determines the data state of the memory cell.

Such an excess of majority charge carriers may result from channel impact ionization, band-to-band tunneling (gate-induced drain leakage "GIDL"), or direct injection. Majority charge carriers may be removed via drain region hole removal, source region hole removal, or drain and source region hole removal, for example, using back gate pulsing.

Often, conventional reading and/or writing operations may lead to relatively large power consumption and large voltage potential swings which may cause disturbance to unselected memory cells in the semiconductor memory device. Also, pulsing between positive and negative gate biases during read and write operations may reduce a net quantity of majority charge carriers in the electrically floating body region of the memory cell, which, in turn, may result in an inaccurate determination of the data state of the memory cell. Furthermore, in the event that a bias signal having a voltage potential that is below a threshold voltage potential of the memory transistor is applied to the gate of the memory transistor, a channel of minority charge carriers beneath the gate may be eliminated. However, some of the minority charge carriers may remain "trapped" in interface defects. Some of the trapped minority charge carriers may combine with majority charge carriers, which may be attracted to the gate as a result of the applied bias signal. As a result, the net quantity of majority charge carriers in the electrically floating body region may be reduced. This phenomenon, which is typically characterized as charge pumping, is problematic because the net quantity of majority charge carriers may be reduced in the electrically floating body region of the memory cell, which, in turn, may result in an inaccurate determination of the data state of the memory cell.

In view of the foregoing, it may be understood that there may be significant problems and shortcomings associated with conventional techniques for operating a semiconductor memory device.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
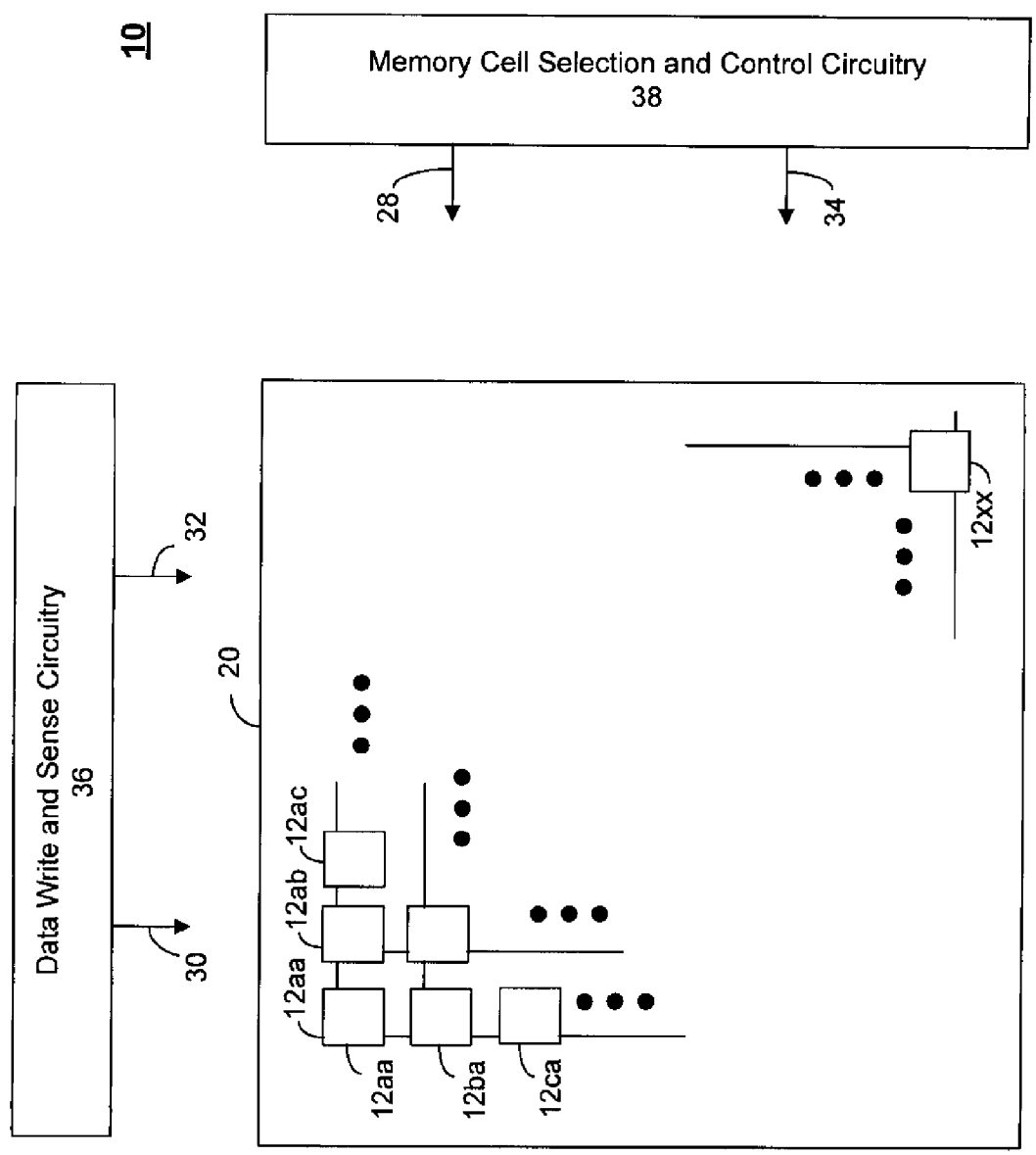
FIG. 1 shows a block diagram of a semiconductor memory device including a memory cell array, data write and sense circuitry, and memory cell selection and control circuitry in accordance with an embodiment of the present disclosure.

Referring to FIG. 1, there is shown a block diagram of a semiconductor memory device 10 comprising a memory cell array 20, data write and sense circuitry 36, and memory cell selection and control circuitry 38 in accordance with an embodiment of the present disclosure. The memory cell array 20 may comprise a plurality of memory cells 12 each coupled to the memory cell selection and control circuitry 38 via a word line (WL) 28 and a carrier injection line (EP) 34, and to the data write and sense circuitry 36 via a bit line (ON) 30 and a source line (EN) 32. It may be appreciated that the bit line (CN) 30 and the source line (EN) 32 are designations used to distinguish between two signal lines and they may be used interchangeably.

The data write and sense circuitry 36 may read data from and may write data to selected memory cells 12. In an exemplary embodiment, the data write and sense circuitry 36 may include a plurality of data sense amplifier circuits. Each data sense amplifier circuit may receive at least one bit line (CN) 30 and a current or voltage reference signal. For example, each data sense amplifier circuit may be a cross-coupled type sense amplifier to sense a data state stored in a memory cell 12. The data write and sense circuitry 36 may include at least one multiplexer that may couple to a data sense amplifier circuit to at least one bit line (CN) 30. In an exemplary embodiment, the multiplexer may couple a plurality of bit lines (CN) 30 to a data sense amplifier circuit.

Each data sense amplifier circuit may employ voltage and/or current sensing circuitry and/or techniques. In an exemplary embodiment, each data sense amplifier circuit may employ current sensing circuitry and/or techniques. For example, a current sense amplifier may compare current from a selected memory cell 12 to a reference current (e.g., the current of one or more reference cells). From that comparison, it may be determined whether the selected memory cell 12 stores a logic high (e.g., binary "1" data state) or a logic low (e.g., binary "0" data state). It may be appreciated by one having ordinary skill in the art that various types or forms of the data write and sense circuitry 36 (including one or more sense amplifiers, using voltage or current sensing techniques, to sense a data state stored in a memory cell 12) may be employed to read data stored in the memory cells 12.

The memory cell selection and control circuitry 38 may select and/or enable one or more predetermined memory cells 12 to facilitate reading data therefrom by applying control signals on one or more word lines (WL) 28 and/or carrier injection lines (EP) 34. The memory cell selection and control circuitry 38 may generate such control signals from address signals, for example, row address signals. Moreover, the memory cell selection and control circuitry 38 may include a word line decoder and/or driver. For example, the memory cell selection and control circuitry 38 may include one or more different control/selection techniques (and circuitry therefor) to select and/or enable one or more predetermined memory cells 12. Notably, all such control/selection techniques, and circuitry therefor, whether now known or later developed, are intended to fall within the scope of the present disclosure.

In an exemplary embodiment, the semiconductor memory device 10 may implement a two step write operation whereby all the memory cells 12 in a row of memory cells 12 may be written to a predetermined data state by first executing a "clear" or a logic low (e.g., binary "0" data state) write operation, whereby all of the memory cells 12 in the row of memory cells 12 are written to logic low (e.g., binary "0" data state). Thereafter, selected memory cells 12 in the row of memory cells 12 may be selectively written to the predetermined data state (e.g., a logic high (binary "1" data state)). The semiconductor memory device 10 may also implement a one step write operation whereby selected memory cells 12 in a row of memory cells 12 may be selectively written to either a logic high (e.g., binary "1" data state) or a logic low (e.g., binary "0" data state) without first implementing a "clear" operation. The semiconductor memory device 10 may employ any of the exemplary writing, preparation, holding, refresh, and/or reading techniques described herein.

The memory cells 12 may comprise N-type, P-type and/or both types of transistors. Circuitry that is peripheral to the memory cell array 20 (for example, sense amplifiers or comparators, row and column address decoders, as well as line drivers (not illustrated herein)) may also include P-type and/or N-type transistors. Regardless of whether P-type or N-type transistors are employed in memory cells 12 in the memory cell array 20, suitable voltage potentials (for example, positive or negative voltage potentials) for reading from the memory cells 12 will be described further herein.

Figure 2:
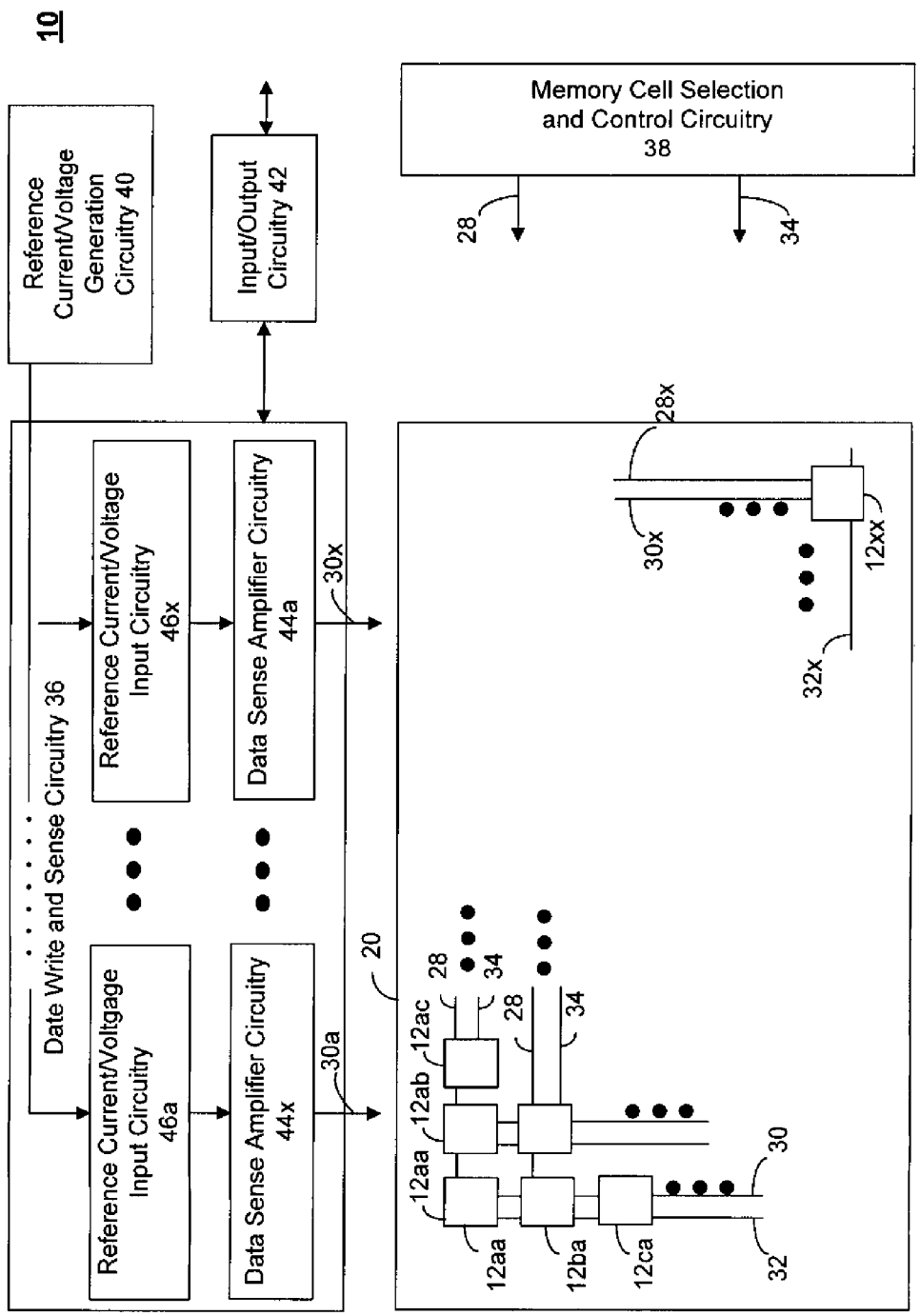
FIG. 2 shows a schematic block diagram of a semiconductor memory device including a memory cell array, data write and sense circuitry, and memory cell selection and control circuitry in accordance with an embodiment of the present disclosure.

Referring to FIG. 2, there is shown a schematic block diagram of a semiconductor memory device 10 including a memory cell array 20, data write and sense circuitry 36, and memory cell selection and control circuitry 38 in accordance with an embodiment of the present disclosure. The semiconductor memory device 10 may include a memory cell array 20, data write and sense circuitry 36, memory cell selection and control circuitry 38, reference current and/or voltage generation circuitry 40, and input/output circuitry 42. The memory cell array 20 may include a plurality of memory cells 12 arranged in a matrix of rows and columns including a plurality of word lines (WL) 28, a plurality of source lines (EN) 32, a plurality of bit lines (CN) 30, and/or a plurality of carrier injection lines (EP) 34. The memory cell array 20 may be coupled to the memory cell selection and control circuitry 38 via the word lines (WL) 28, and/or the carrier injection line (EP) 34. Also, the memory cell array 20 may be coupled to the data write and sense circuitry 36 via the source lines (EN) 32 and/or the bit lines 30 (CN).

In an exemplary embodiment, the data write and sense circuitry 36 may include a plurality of data sense amplifier circuitry 44 (e.g., 44a-44x) and a plurality of reference current and/or voltage input circuitry 46 (e.g., 46a-46x). Each data sense amplifier circuitry 44 may be coupled to at least one bit line (CN) 30 and an output of the reference current and/or voltage generator circuitry 40 (for example, a current or voltage potential reference signal) via a corresponding reference current and/or voltage input circuitry 46. For example, each data sense amplifier circuitry 44 may be a cross-coupled type of sense amplifier to detect, determine, sense, and/or sample a data state (e.g., logic low (binary "0" data state) and/or logic high (binary "1" data state)) stored in a memory cell 12. Each data sense amplifier circuitry 44 may detect a data state of one or more memory cells 12 (e.g., along selected bit lines (CN) 30a-30x) by comparing voltage potentials or currents on a selected bit line (CN) 30 with voltage potentials or currents of the output of the reference current and/or voltage generator circuitry 40.

Also, each data sense amplifier circuitry 44 may detect a data state of one or more memory cells 12 (e.g., along selected bit lines (CN) 30a-30x) by comparing voltage potential or current on a selected bit line (CN) 30 with the voltage potential or current on an unselected pre-charged bit line (CN) 30. For example, the voltage potential or current on the unselected pre-charged bit line (CN) 30 may be a hold voltage potential or current associated with the one or more memory cells 12 in order to retain a data state for a predetermined amount of time. Also, a predetermined voltage potential or current may be applied to a bit line (CN) 30 based at least in part on a data state determined by the data sense amplifier circuitry 44 to write-back the data state to one or more memory cells 12. In another exemplary embodiment, a predetermined voltage potential (e.g., voltage data state) may be applied to a bit line (CN) 30 to write-back a plurality of data states stored in the one or more memory cells 12.

The data sense amplifier circuitry 44 may employ voltage and/or current sensing circuitry and/or techniques. In an exemplary embodiment, the data sense amplifier circuitry 44 may employ current sensing circuitry and/or techniques wherein the data sense amplifier circuitry 44 may compare current generated from a selected memory cell 12 to a reference current generated from the reference current and/or voltage input circuitry 46, for example, the current of one or more reference cells. From that comparison, it may be determined whether the memory cell 12 contains a logic high (binary "1" data state, relatively more majority charge carriers contained within the memory cell 12) or a logic low (binary "0" data state, relatively less majority charge carriers contained within the memory cell 12).

In another exemplary embodiment, the data sense amplifier circuitry 44 may employ voltage potential sensing circuitry and/or techniques wherein the data sense amplifier circuitry 44 may compare voltage potential from a selected memory cell 12 to a reference voltage potential from the reference current and/or voltage input circuitry 46, for example, the voltage potential of one or more reference cells. From that comparison, it may be determined whether the memory cell 12 contains a logic high (binary "1" data state, relatively more majority charge carriers contained within the memory cell 12) or a logic low (binary "0" data state, relatively less majority charge carriers contained within the memory cell 12).

The memory cell selection and control circuitry 38 may select and/or enable one or more predetermined memory cells 12 to facilitate reading data therefrom and/or writing data thereto by applying control signals on one or more word lines (WL) 28 and/or carrier injection line (EP) 34. The memory cell selection and control circuitry 38 may generate such control signals using address signals, for example, row address signals. Moreover, memory cell selection and control circuitry 38 may include a word line decoder and/or driver and a carrier injection line decoder and/or driver (not shown). For example, memory cell selection and control circuitry 38 may include one or more different control/selection techniques (and circuitry therefor) to implement memory cell selection techniques. Such techniques, and circuitry therefor, are well known to those skilled in the art. Notably, all such control/selection techniques, and circuitry therefor, whether now known or later developed, are intended to fall within the scope of the present disclosures.

The semiconductor memory device 10 may employ any of the exemplary writing, holding, and/or reading techniques described herein. Moreover, exemplary voltage values for each of the control signals for a given operation (for example, writing, holding, or reading) may be employed in the semiconductor memory device 10 according to exemplary embodiments of the present disclosure.

Figure 3:
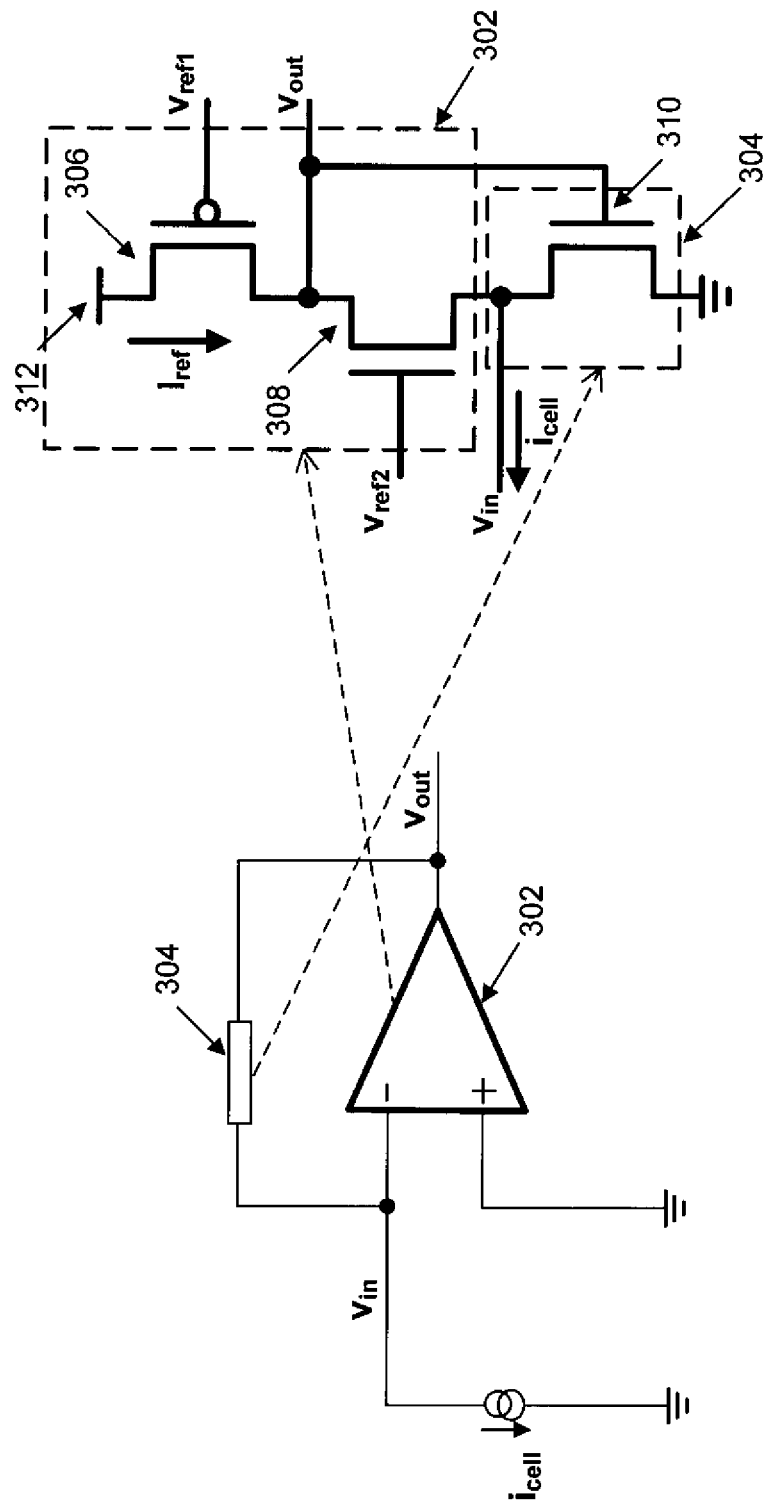
FIG. 3 shows a schematic diagram of data sense amplifier circuitry in accordance with an embodiment of the present disclosure.

Referring to FIG. 3, there is shown a schematic diagram of data sense amplifier circuitry 44 in accordance with an embodiment of the present disclosure. The data sense amplifier circuitry 44 may comprise amplifier circuitry 302 and resistive circuitry 304. The amplifier circuitry 302 may comprise one or more input nodes. For example, a first input node ($V_{in}$) of the amplifier circuitry 302 may be coupled to one or more memory cells 12 via a corresponding bit line (CN) 30. A second input node of the amplifier circuitry 302 may be coupled to an electrical ground. The resistive circuitry 304 may be coupled to an input node ($V_{in}$) and the output node ($V_{out}$) of the amplifier circuitry 302. In an exemplary embodiment, the resistive circuitry 304 may be coupled to the first input node ($V_{in}$) (e.g., coupled to the memory cell 12 via the bit line (CN) 30) and the output node ($V_{out}$) of the amplifier circuitry 302. The resistive circuitry 304 may form a feedback loop between the first input node ($V_{in}$) and the output node ($V_{out}$) of the amplifier circuitry 302. In an exemplary embodiment, the feedback loop formed by the amplifier circuitry 302 and the resistive circuitry 304 may amplify the input current ($i_{cell}$) at the input node ($V_{in}$) and output as amplified voltage potential at the output node ($V_{out}$). The resistive circuitry 304 may have a predetermined resistance in order to generate a sufficient output voltage potential and/or output current at the output node ($V_{out}$) of the amplifier circuitry 302 based at least in part on the voltage potential and/or current on the bit line (CN) 30. The predetermined resistance of the resistive circuitry 304 may also impose a variation on the output node ($V_{out}$) of the amplifier circuitry 302.

The amplifier circuitry 302 and the resistive circuitry 304 of the data sense amplifier circuitry 44 may be implemented via one or more transistors. The one or more transistors that may implement the data sense amplifier circuitry 44 may include various types of transistors. For example, the one or more transistor may include metal oxide semiconductor field effect transistors (MOSFETs) and/or junction field effect transistors (JFETs). The one or more transistors may include N-channel field effect transistors and/or P-channel field effect transistors.

The amplifier circuitry 302 may be implemented via a power transistor 306 and/or a switching transistor 308. In an exemplary embodiment, the power transistor 306 and the switching transistor 308 may be coupled to each other in a series configuration. The power transistor 306 may be coupled to a power source 312 (e.g., a voltage potential source and/or a current source) that may supply a biasing current ($I_b$). In an exemplary embodiment, the power source 312 may be coupled to the reference current/voltage input circuitry 46 in order to supply the biasing current ($I_b$) to the power transistor 306. The power transistor 306 may couple the biasing current ($I_b$) supplied by the power source 312 to the output node ($V_{out}$) of the amplifier circuitry 302. The switching transistor 308 may be coupled to one or more memory cells 12 via the corresponding bit lines (CN) 30. The switching transistor 308 may couple the voltage potential and/or current generated by the memory cell 12 on the bit line (CN) 30 to the output node ($V_{out}$) of the amplifier circuitry 302.

One or more control signals may be applied to the power transistor 306 and/or the switching transistor 308 in order to control the operations of the power transistor 306 and/or the switching transistor 308. A first control signal ($V_{ref1}$) may be applied to the power transistor 306 in order to activate or deactivate the power transistor 306. In an exemplary embodiment, the first control signal ($V_{ref1}$) may activate (e.g., turn to an "ON" state) the power transistor 306 in order to couple the biasing current ($I_b$) to the output node ($V_{out}$) of the amplifier circuitry 302. In another exemplary embodiment, the first control signal ($V_{ref1}$) may deactivate the power transistor 306 in order to decouple the biasing current ($I_b$) from the output node ($V_{out}$) of the amplifier circuitry 302.

A second control signal ($V_{ref2}$) may be applied to the switching transistor 308 in order to activate or deactivate the switching transistor 308. In an exemplary embodiment, a second control signal ($V_{ref2}$) may activate (e.g., turn to an "ON" state) the switching transistor 308 in order to couple the voltage potential and/or current at the input node ($V_{in}$) and/or on the bit line (CN) 30 to the output node ($V_{out}$) of the amplifier circuitry 302. In another exemplary embodiment, the second control signal ($V_{ref2}$) may deactivate the switching transistor 308 in order to decouple the voltage potential and/or current at the input node ($V_{in}$) and/or on the bit line (CN) 30 to the output node ($V_{out}$) of the amplifier circuitry 302.

The resistive circuitry 304 may be implemented via a resistive transistor 310. The resistive transistor 310 may be coupled to one or more memory cells 12 via the corresponding bit lines (CN) 30. The resistive transistor 310 may be also coupled to the switching transistor 308. The resistive transistor 310 and the switching transistor 308 may be coupled to each other in a series configuration. The resistive transistor 310 may be coupled to the output node ($V_{out}$) of the amplifier circuitry 302. For example, the gate region of the resistive transistor 310 may be coupled to the output node ($V_{out}$) of the amplifier circuitry 302. The voltage potential and/or current at the output node ($V_{out}$) may activate or deactivate the resistive transistor 310. In an exemplary embodiment, the voltage potential and/or current at the output node ($V_{out}$) may activate (e.g., turn to an "ON" state) the resistive transistor 310 in order to lower a resistance of the resistive transistor 310. In another exemplary embodiment, the voltage potential and/or current at the output node ($V_{out}$) may deactivate the resistive transistor 310 in order to raise a resistance of the resistive transistor 310. Thus, the resistive transistor 310 forms a feedback loop between the input node ($V_{in}$) and the output node ($V_{out}$) of the amplifier circuitry 302.

During a read operation, the input node ($V_{in}$) of the amplifier circuitry 302 may be pre-charged to a predetermined voltage potential level and/or a predetermined current level, which may be used as a reference voltage potential and/or a reference current to read a data state stored in the memory cell 12. For example, the power source 312 may apply a biasing current ($I_b$) to the amplifier circuitry 302. The power transistor 306 may control an amount of biasing current ($I_b$) supplied to the amplifier circuitry 302. In an exemplary embodiment, the first control signal ($V_{ref1}$) may control an operation mode (e.g., activate or deactivate) of the power transistor 306 in order to control an amount of biasing current ($I_b$) supplied to the amplifier circuitry 302. The second control signal ($V_{ref2}$) may be applied to the switching transistor 308 in order to couple the input node ($V_{in}$) and the output node ($V_{out}$) of the amplifier circuitry 302. The switching transistor 308 may also couple the biasing current ($I_b$) to the input node ($V_{in}$) and pre-charge the input node ($V_{in}$) and/or the bit line (CN) 30 to a predetermined voltage potential level and/or a predetermined current level, which may be used as a reference voltage potential and/or a reference current to read a data state stored in the memory cell 12.

One or more control signals may be applied to the memory cell 12 (e.g., via a corresponding word line (WL) 28, a corresponding source line (EN) 32 and/or a corresponding carrier injection line (EP) 34) in order to activate the memory cell 12 to perform a read operation. In an exemplary embodiment, when a logic low (e.g., binary "0" data state) is stored in the memory cell 12, a small amount of or no voltage potential and/or current may be generated due to small amount or no majority charge carriers that are stored in the memory cell 12.

The input node ($V_{in}$) of the amplifier circuitry 302 may detect small amount of or no voltage potential and/or current variation. In another exemplary embodiment, when a logic high (e.g., binary "1" data state) is stored in the memory cell 12, a larger amount of voltage potential and/or current may be generated due to large amount of majority charge carriers that are stored in the memory cell 12. The input node ($V_{in}$) of the amplifier circuitry 302 may detect the larger amount of voltage potential and/or current variation. The voltage potential and/or current variation at the input node ($V_{in}$) may be amplified at the output node ($V_{out}$) by the switching transistor 308 (e.g., operating in a saturation mode).

Figure 4:
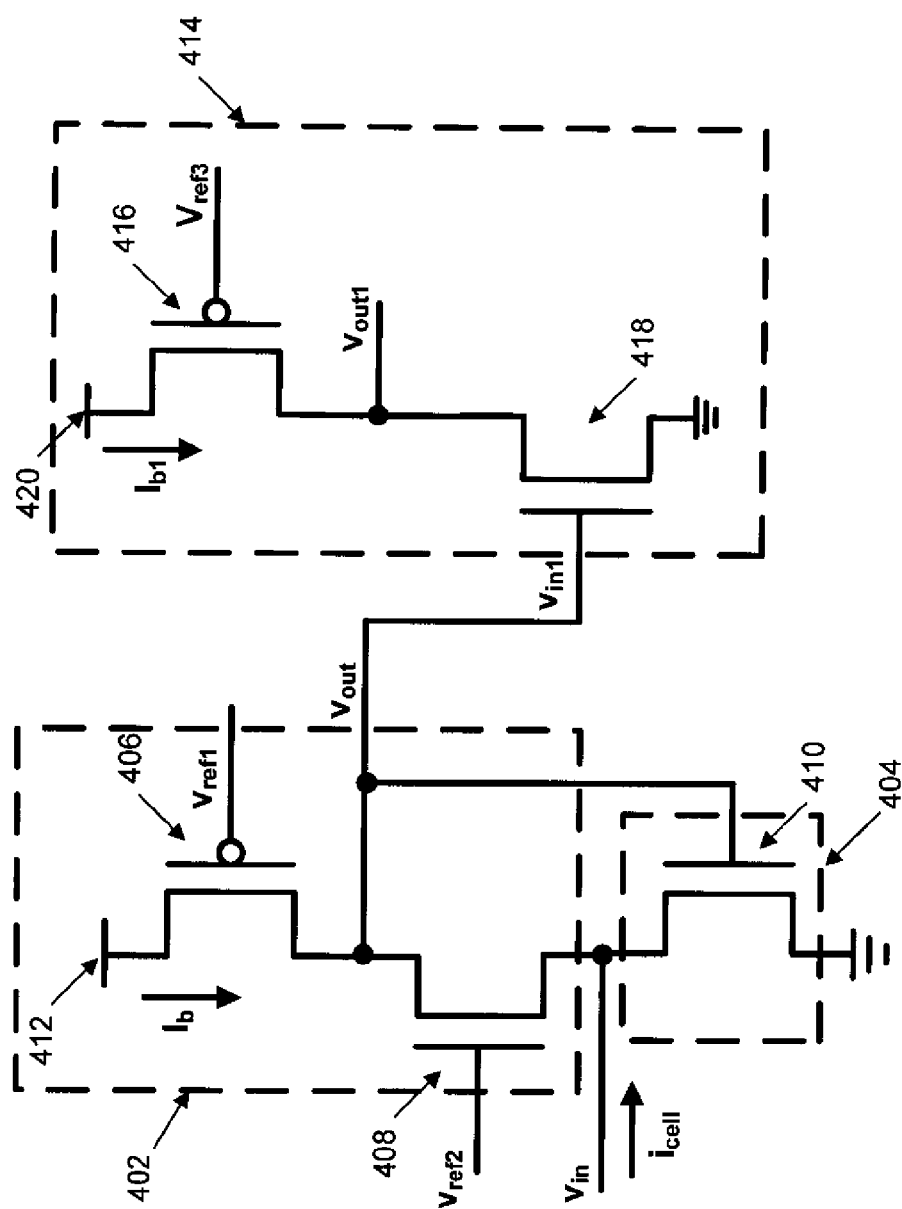
FIG. 4 shows a schematic diagram of data sense amplifier circuitry in accordance with an alternate embodiment of the present disclosure.

Referring to FIG. 4, there is shown a schematic diagram of data sense amplifier circuitry 44 in accordance with an alternate embodiment of the present disclosure. The data sense amplifier circuitry 44 illustrated in FIG. 4 may be similar to the data sense amplifier circuitry 44 illustrated in FIG. 3, except that the data sense amplifier circuitry 44 may comprise first amplifier circuitry 402, resistive circuitry 404, and/or second amplifier circuitry 414. The first amplifier circuitry 402 may comprise a first power transistor 406 and/or a first switching transistor 408. The resistive circuitry 404 may be implemented via a resistive transistor 410. The second amplifier circuitry 414 may include a second power transistor 416 and a second switching transistor 418. The first amplifier circuitry 402 may be coupled to the second amplifier circuitry 414. For example, the output node ($V_{out}$) of the first amplifier circuitry 402 may be coupled to the input node ($V_{in1}$) of the second amplifier circuitry 414.

The second power transistor 416 and the second switching transistor 418 may be coupled to each other in a series configuration. In an exemplary embodiment, the second switching transistor 418 may be similar to or same as the first switching transistor 408. In another exemplary embodiment, the second switching transistor 418 may have a different size from the first switching transistor 408. For example, the second switching transistor 418 may have a size configured to be twice the size as the first switching transistor 408.

The output signal from the first amplifier circuitry 402 may be applied to the second switching transistor 418. In an exemplary embodiment, the output signal (e.g., via the output node ($V_{out}$)) from the first amplifier circuitry 402 may be applied to the gate region of the second switch transistor 418 in order to further amplify the output signals (e.g., voltage potential and/or current) of the first amplifier circuitry 402. For example, the output signal from the first amplifier circuitry 402 may control an operation mode (e.g., activate or deactivate) of the second switching transistor 418. In an exemplary embodiment, the output signal from the first amplifier circuitry 402 may activate (e.g., turn to an "ON" state) the second switching transistor 418 in order to couple the output signal of the amplifier circuitry 402 to the output node ($V_{out1}$) of the second amplifier circuitry 414. In another exemplary embodiment, the output signal from the amplifier circuitry 402 may deactivate the second switching transistor 418 in order to decouple the output signal of the amplifier circuitry 402 to the output node ($V_{out1}$) of the second amplifier circuitry 414.

The second power transistor 416 may be coupled to a second power source 420 in order to provide a second biasing current ($I_{b1}$) to the second amplifier circuitry 414. The second power source 420 (e.g., a voltage potential source and/or a current source) may supply a second biasing current ($I_{b1}$) equal to or higher than the first biasing current ($I_b$). In an exemplary embodiment, the second power source 420 may be coupled to the reference current/voltage input circuitry 46 in order to supply a second biasing current ($I_{b1}$) to the second power transistor 416. The second power transistor 416 may couple the second biasing current ($I_{b1}$) supplied by the second power source 420 to the output node ($V_{out1}$) of the second amplifier circuitry 414.

The second power transistor 416 may be similar to or same as the first power transistor 406. In another exemplary embodiment, the second power transistor 416 may have a different size than the first power transistor 406. For example, the second power transistor 416 may have a size configured to be twice the size as the first power transistor 406. In other exemplary embodiments, the second power transistor 416 may be configured to have a size to output a predetermined voltage potential (e.g., Vdd) at the output node ($V_{out1}$) of the second amplifier circuitry 414, when the current ($i_{cell}$) on the bit line (CN) 30 is zero.

One or more control signals may be applied to the second power transistor 406 in order to control the operations of the second power transistor 406. A third control signal ($V_{ref3}$) may be applied to the second power transistor 406 in order to activate or deactivate the second power transistor 406. In an exemplary embodiment, the third control signal ($V_{ref3}$) may activate (e.g., turn to an "ON" state) the second power transistor 416 in order to couple the second biasing current ($I_{b1}$) to the output node ($V_{out1}$) of the second amplifier circuitry 414. In another exemplary embodiment, the third control signal ($V_{ref3}$) may deactivate the second power transistor 416 in order to decouple the second biasing current ($I_{b1}$) from the output node ($V_{out1}$) of the second amplifier circuitry 414.

Figure 5:
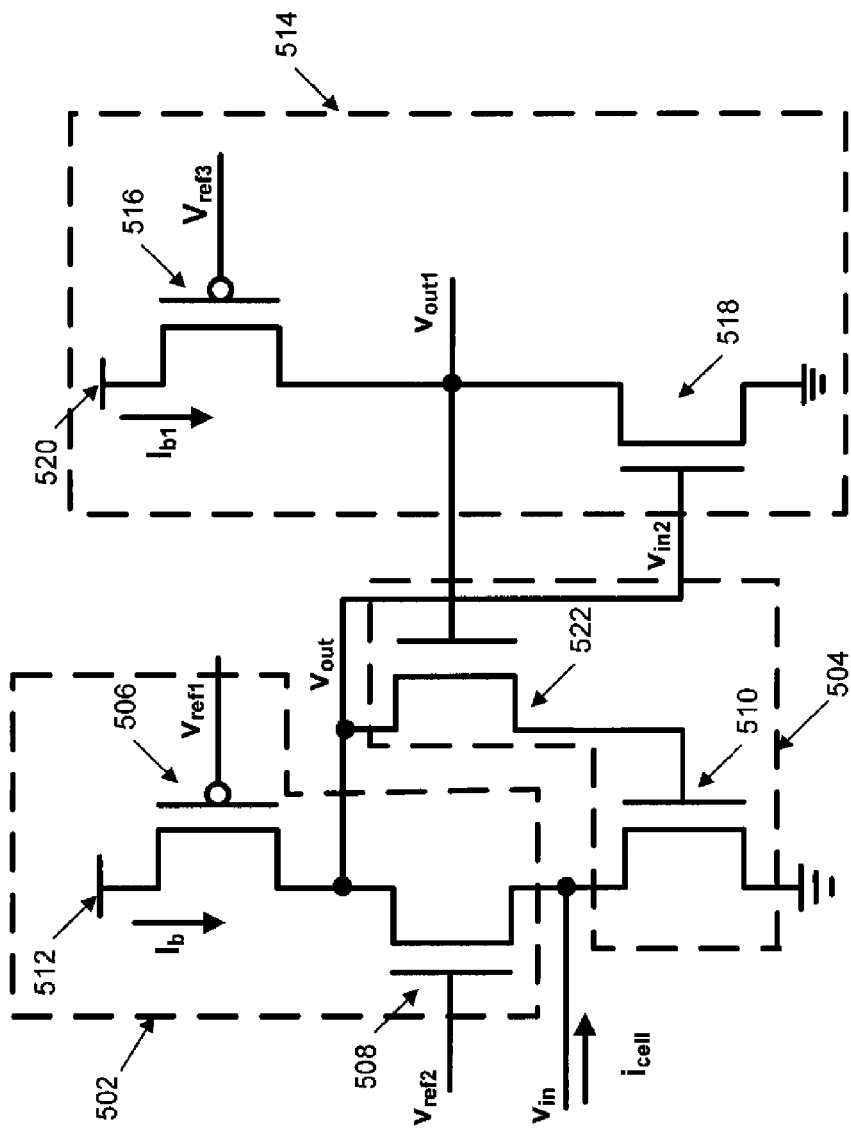
FIG. 5 shows a schematic diagram of data sense amplifier circuitry in accordance with an other alternate embodiment of the present disclosure.

Referring to FIG. 5, there is shown a schematic diagram of data sense amplifier circuitry 44 in accordance with an alternate embodiment of the present disclosure. The data sense amplifier circuitry 44 illustrated in FIG. 5 may be similar to the data sense amplifier circuitry 44 illustrated in FIG. 4, except that the data sense amplifier circuitry 44 may comprise first amplifier circuitry 502, resistive circuitry 504 comprising a first resistive transistor 510 and a second resistive transistor 522, and/or second amplifier circuitry 514. For example, the resistive circuitry 504 may be implemented via the first resistive transistor 510 and the second resistive transistor 522. The first resistive transistor 510 and the second resistive transistor 522 may be coupled to each other in a series configuration in order to provide additional resistance in the feedback loop between the input node ($V_{in}$) and the output node ($V_{out}$) of the first amplifier circuitry 502.

In an exemplary embodiment, the first resistive transistor 510 may be coupled to one or more memory cells 12 via the corresponding bit lines (CN) 30. The first resistive transistor 510 may be controlled by an output of the second resistive transistor 522. For example, the gate region of the first resistive transistor 510 may be coupled to the drain region of the second resistive transistor 522. Therefore, the output of the second resistive transistor 522 may control an operation mode (e.g., activate or deactivate) of the first resistive transistor 510. The second resistive transistor 522 may be coupled to the output node ($V_{out1}$) of the second amplifier circuitry 514. For example, the gate region of the second resistive transistor 522 may be coupled to the output node ($V_{out}$) of the second amplifier circuitry 514. The voltage potential and/or current at the output node ($V_{out1}$) may gradually activate or deactivate the resistive circuitry 504 (e.g., the first resistive transistor 510 and the second resistive transistor 522). In an exemplary embodiment, when the voltage potential and/or current at the output node ($V_{out1}$) of the second amplifier circuitry 514 decreases, the equivalent resistance of the resistive circuitry 504 (e.g., the equivalent resistance of the first resistive transistor 510 coupled in series with the equivalent resistance of the second resistive transistor 522) may gradually increase and thus increasing a gain of the first amplifier circuitry 502.

In an exemplary embodiment, an increase in the voltage potential and/or current at the output node ($V_{out1}$) of the second amplifier circuitry 514 may activate (e.g., turn to an "ON" state) the second resistive transistor 522 in order to lower a resistance of the second resistive transistor 522. The output of the second resistive transistor 522 may activate (e.g., turn to an "ON" state) the first resistive transistor 510 in order to lower a resistance of the first resistive transistor 510. In another exemplary embodiment, a decrease in the voltage potential and/or current at the output node ($V_{out1}$) of the second amplifier circuitry 514 may deactivate the second resistive transistor 522 in order to raise a resistance of the second resistive transistor 522. The output of the second resistive transistor 522 may deactivate the first resistive transistor 510 in order to raise a resistance of the first resistive transistor 510. Thus, the resistance in the feedback loop between the input node ($V_{in}$) of the first amplifier circuitry 502 and the output node ($V_{out1}$) of the second amplifier circuitry 514 may be increased.

Figure 6:
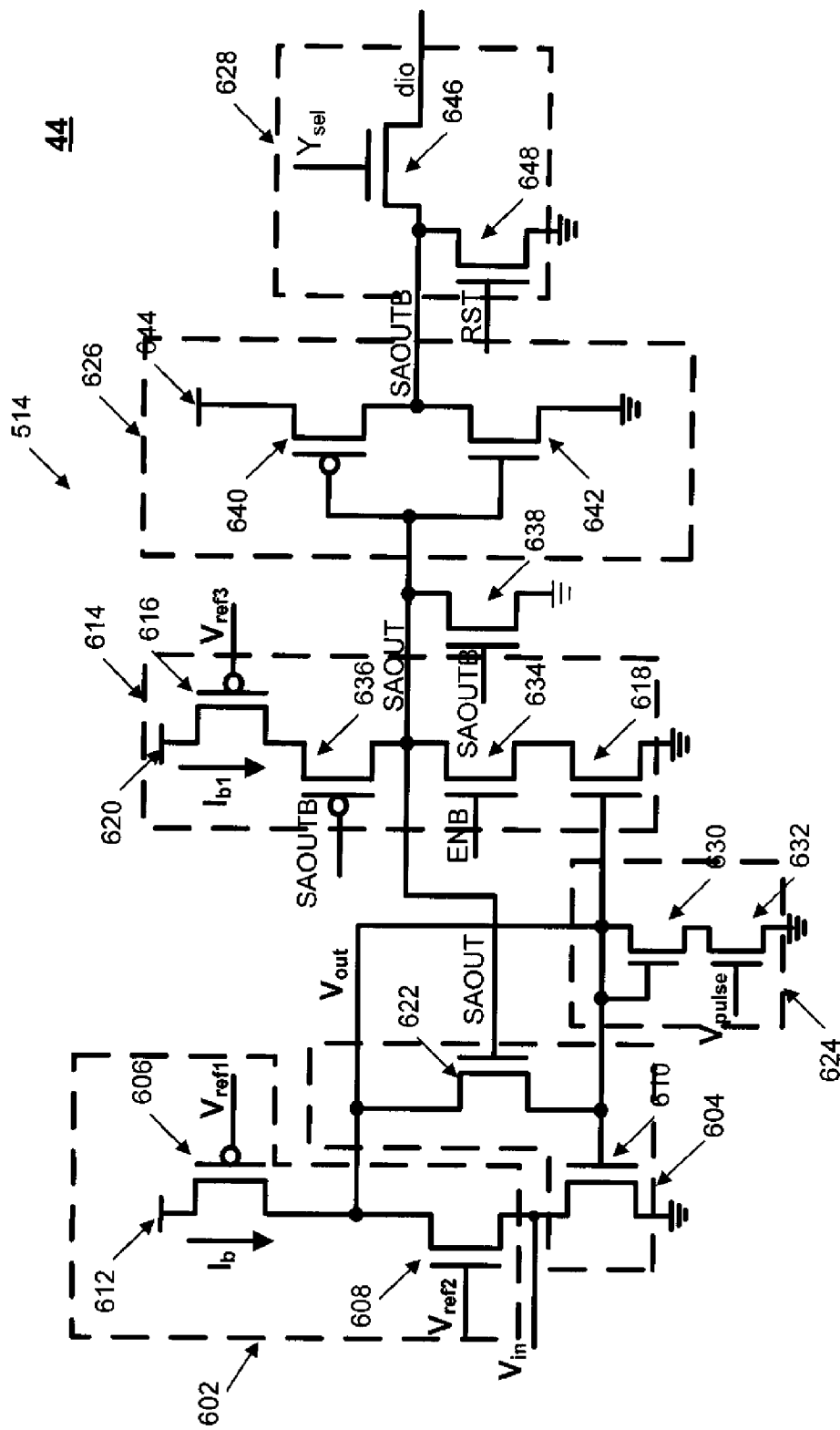
FIG. 6 shows a schematic diagram of data sense amplifier circuitry in accordance with an other alternate embodiment of the present disclosure.

Referring to FIG. 6, there is shown a schematic diagram of data sense amplifier circuitry 44 in accordance with an alternate embodiment of the present disclosure. The data sense amplifier circuitry 44 illustrated in FIG. 6 may be similar to the data sense amplifier circuitry 44 illustrated in FIG. 5, except that the data sense amplifier circuitry 44 may comprise first amplifier circuitry 602, resistive circuitry 604, second amplifier circuitry 614, pre-charge circuitry 624, inverting circuitry 626, and/or an input/output circuitry 628.

The pre-charge circuitry 624 may be coupled to the output node ($V_{out}$) of the first amplifier circuitry 602. The pre-charge circuitry 624 may pre-charge the first amplifier circuitry 602 to a predetermined voltage potential (e.g., DC operating voltage potential) and/or current in order to sense a data state (e.g., a logic low (e.g., binary "0" data state) and/or a logic high (e.g., binary "1" data state)) stored in the memory cell 12. The pre-charge circuitry 624 may include a first pre-charge transistor 630 and a second pre-charge transistor 632. The first pre-charge transistor 630 and the second pre-charge transistor 632 may be arranged in a series configuration. For example, the drain region of the first pre-charge transistor 630 may be coupled to the source region of the second pre-charge transistor 632. The first pre-charge transistor 630 may be coupled to the output node ($V_{out}$) of the first amplifier circuitry 602. For example, the source region and/or the gate region of the first pre-charging transistor 630 may be coupled to the output node ($V_{out}$) of the first amplifier circuitry 602. The second pre-charge transistor 632 may be controlled by a pulse control signal ($V_{pulse}$) applied to the gate region of the second pre-charge transistor 632.

During a preconditioning of the first amplifier circuitry 602, the output node ($V_{out}$) of the first amplifier circuitry 602 may be pre-charged to a predetermined voltage potential (e.g., DC operating voltage potential) and/or current. For example, a first control signal ($V_{ref1}$) may be applied to the power transistor 606 to turn the power transistor 606 to an "ON" state in order to couple a first biasing current ($I_b$) to the first amplifier circuitry 602. A second control signal ($V_{ref2}$) may be applied to the switching transistor 608 in order to turn the switch transistor 608 to an "ON" state to pre-charge the input node ($V_{in}$) of the first amplifier circuitry 602 to a predetermined voltage potential and/or current. The predetermined voltage potential and/or current at the output node ($V_{out}$) of the first amplifier circuitry 602 may decrease when the first biasing current ($I_b$) flows from the output node ($V_{out}$) to the input node ($V_{in}$) of the first amplifier circuitry 602.

The pre-charge circuitry 624 may recharge the output node ($V_{out}$) of the first amplifier circuitry 602 to the predetermined voltage potential (e.g., DC operating voltage potential) and/or current. In an exemplary embodiment, a pulse control signal ($V_{pulse}$) may be applied to the second pre-charge transistor 632 to turn the second pre-charge transistor 632 to an "ON" state. A voltage potential and/or current may be supplied to the output node ($V_{out}$) of the first amplifier circuitry 602 via the first pre-charge transistor 630 and the second pre-charge transistor 632. Thus, the output node ($V_{out}$) of the first amplifier circuitry 602 may return to the predetermined voltage potential (e.g., DC operating voltage potential) and/or current in order to perform one or more operations. Once the preconditioning of the first amplifier circuitry 602 is complete, the pulse control signal ($V_{pulse}$) may be withdrawn from the second pre-charge transistor 632 and turn the second pre-charge transistor 632 to an "OFF" state in order to stop charging the output node ($V_{out}$) of the first amplifier circuitry 602.

The second amplifier circuitry 614 may comprise a second coupling transistor 634 coupled to the input node ($V_{in}$) of the second amplifier circuitry 614. The second coupling transistor 634 also may be coupled to the second power transistor 616 in order to couple the second biasing current ($I_{b1}$) to the input node ($V_{in}$) of the second amplifier circuitry 614. A control signal (ENB) may be applied to the second coupling transistor 634 in order to control an operation mode (e.g., "ON" state or "OFF" state) of the second coupling transistor 634. For example, the second coupling transistor 634 may turn to an "OFF" state when the control signal (ENB) is withdrawn from the second coupling transistor 634. When the second coupling transistor 634 is turned to an "OFF" state, the second coupling transistor 634 may prevent the second biasing current ($I_{b1}$) flow through the second amplifier circuitry 614. The application of a control signal (ENB) to the second coupling transistor 634 may turn the second coupling transistor 634 to an "ON" state. The second coupling transistor 634 may couple the second biasing current ($I_{b1}$) to the input node ($V_{in}$) of the second amplifier circuitry 614 when the second coupling transistor 634 is turned to an "ON" state.

The second amplifier circuitry 614 may include a transistor 636 and a transistor 638. The gate region of the transistor 636 and the gate region of the transistor 638 may be coupled to the output node (SAOUTB) of the inverter circuitry 626. In an exemplary embodiment, the power transistor 616, the transistor 636 and/or the transistor 638 may form an input inverter circuitry. For example, the input inverter circuitry and the inverter circuitry 626 may form a latch device. The Latch device may comprise of the input inverter circuitry (e.g., the power transistor 616, the transistor 636, and/or the transistor 638) coupled to the output node (SAOUTB) of the inverter circuitry 626. The latch device may turn the first amplifier circuitry 602 (e.g., by applying a second control signal ($V_{ref2}$) to switch the first switching transistor 608 to an "OFF" state) and the second amplifier circuitry 614 (e.g., by applying a control signal (ENB) to switch the second coupling transistor 634 to an "OFF" state) to an "OFF" state as soon as the completion of a sensing operation. The data sense amplifier circuitry 44 may consume less power when the first amplifier circuitry 602 and the second amplifier circuitry 614 are turned to an "OFF" state after the completion of the sensing operation.

The inverter circuitry 626 may be coupled to the output node (SAOUT) of the second amplifier circuitry 614. The inverter circuitry 626 may include a first P-type transistor 640 and a second N-type transistor 642. The first P-type transistor 640 and the second N-type transistor 642 may be arranged in a series configuration. For example, the drain region of the P-type transistor 640 may be coupled to the drain region of the N-type transistor 642. The drain regions of the P-type transistor 640 and the N-type transistor 642 may form the output node (SAOUTB) of the inverter circuitry 626. The gate region of the P-type transistor 640 and the gate region of the N-type transistor 642 may be coupled to the output node (SAOUT) of the second amplifier circuitry 614.

The input/output circuitry 628 may be coupled to the output node (SAOUTB) of the inverter circuitry 626. The input/output circuitry 628 may include a selection transistor 646 and a reset transistor 648. For example, the selection transistor 646 and the reset transistor 648 may be arranged in a parallel configuration. For example, the selection transistor 646 and the reset transistor 648 may be coupled to the output node (SAOUTB) of the inverter circuitry 626. A selection control signal ($V_{sel}$) may be applied to the selection transistor 646 in order to control an operation mode (e.g., an "ON" state or an "OFF" state) of the selection transistor 646. Also, a programming control signal (dio) may be applied to the selection transistor 646 in order to perform a programming operation. A reset control signal ($V_{reset}$) may be applied to the reset transistor 648 in order to control an operation mode (e.g., an "ON" state or an "OFF" state) of the reset transistor 648. In an exemplary embodiment, a selection control signal ($V_{sel}$) may be applied to the selection transistor 646 in order to output a data state (e.g., a logic low (e.g., binary "0" data state) and/or a logic high (e.g., binary "1" data state)) determined by the data sense amplifier circuitry 44. Also, a programming control signal (dio) may be applied to the selection transistor 646 in order to program a data state (e.g., a logic low (e.g., binary "0" data state) and/or a logic high (e.g., binary "1" data state)) into the memory cell 12. In another exemplary embodiment, a reset control signal may be applied to the reset transistor 648 in order to reset the output of the of the data sense amplifier circuitry 44.

Figure 7:
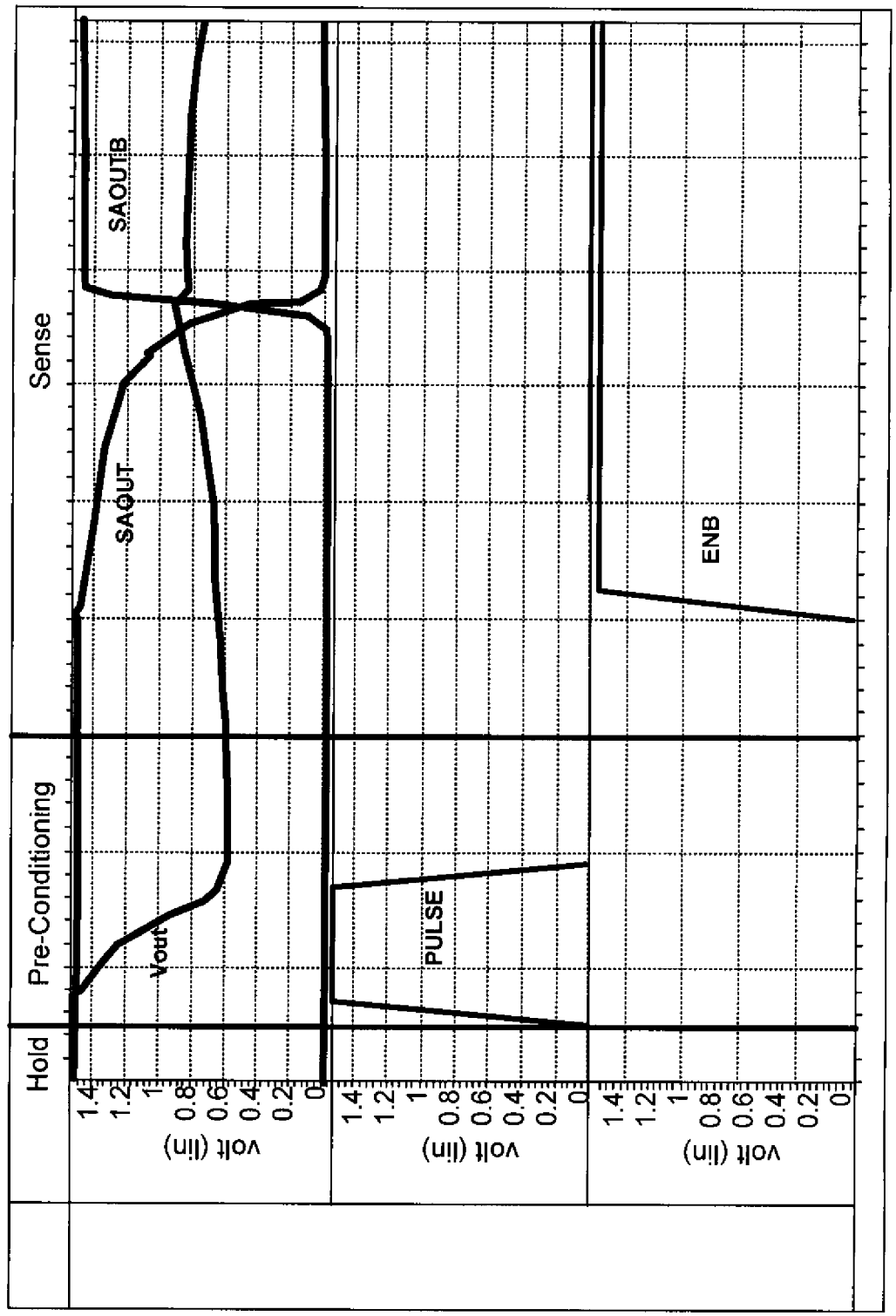
FIG. 7 shows control signal voltage waveforms for biasing the data sense amplifier circuitry shown in FIG. 6 during various operations in accordance with an embodiment of the present disclosure.

Referring to FIG. 7, there are shown control signal voltage waveforms for biasing the data sense amplifier circuitry 44 shown in FIG. 6 during various operations in accordance with an embodiment of the present disclosure. During a hold operation where a data state (e.g., a logic high (binary "1" data state) or a logic low (binary "0" data state)) is stored in the memory cell 12, the data sense amplifier circuitry 44 may be biased to an "OFF" state. In particular, a first control signal ($V_{ref1}$) may be applied to the power transistor 606 to turn the power transistor 606 to an "ON" state to couple the power source 612 to the first amplifier circuitry 602. A second control signal ($V_{ref2}$) may be applied to the first switching transistor 608 in order to turn the first switching transistor 608 to an "OFF" state. When the first switching transistor 608 is turned to an "OFF" state, the output node ($V_{out}$) of the first amplifier circuitry 602 may be charged to a voltage potential (e.g., DC operating voltage potential) and/or current supplied by the power source 612.

A control signal (ENE) may be applied to the second coupling transistor 634 to turn the second coupling transistor 634 to an "OFF" state. The output node (SAOUT) of the second amplifier circuitry 614 may be charged to the same voltage potential (e.g., DC operating voltage potential) as the output node ($V_{out}$) of the first amplifier circuitry 614. A reset control signal ($V_{reset}$) may be applied to the reset transistor 648 in order to reset the output of the of the data sense amplifier circuitry 44. The input node ($V_{in}$) of the first amplifier circuitry 602 may be coupled to an electrical ground in order to prevent a disturbance to the memory cell 12 via the bit line (CN) 30.

During a preconditioning operation, the output node ($V_{out}$) of the first amplifier circuitry 602 may be pre-charged to a predetermined voltage potential (e.g., DC operating voltage potential) and/or current. For example, a first control signal ($V_{ref1}$) may be applied to the power transistor 606 to turn the power transistor 606 to an "ON" state in order to couple a first biasing current ($I_b$) to the first amplifier circuitry 602. A second control signal ($V_{ref2}$) may be applied to the first switching transistor 608 in order to turn the first switch transistor 608 to an "ON" state to pre-charge the input node ($V_{in}$) of the first amplifier circuitry 602 to a predetermined voltage potential and/or current. The predetermined voltage potential and/or current at the output node ($V_{out}$) of the first amplifier circuitry 602 may decrease when the first biasing current ($I_b$) flows from the output node ($V_{out}$) to the input node ($V_{in}$) of the first amplifier circuitry 602 in order to pre-charge the bit line (CN) 30 coupled to the memory cell 12.

In order to recharge the output node ($V_{out}$) of the first amplifier circuitry 602 to the predetermined voltage potential (e.g., DC operating voltage potential) and/or current, a pulse control signal ($V_{pulse}$) may be applied to the pre-charge circuitry 624. In an exemplary embodiment, a pulse control signal ($V_{pulse}$) may be applied to the second pre-charge transistor 632 to turn the second pre-charge transistor 632 to an "ON" state. The pulse control signal ($V_{pulse}$) may be applied to the second pre-charge transistor 632 before the application of the second, control signal ($V_{ref2}$) to the first switching transistor 608. A voltage potential and/or current may be supplied to the output node ($V_{out}$) of the first amplifier circuitry 602 via the first pre-charge transistor 630 and the second pre-charge transistor 632. Thus, the output node ($V_{out}$) of the first amplifier circuitry 602 may return to the predetermined voltage potential (e.g., DC operating voltage potential) and/or current in order to perform one or more operations. Once the preconditioning of the first amplifier circuitry 602 is complete, the pulse control signal ($V_{pulse}$) may be withdrawn from the second pre-charge transistor 632 and turn the second pre-charge transistor 632 to an "OFF" state in order to stop charging the output node ($V_{out}$) of the first amplifier circuitry 602.

During a sensing operation, a control signal (ENB) may be applied to the second coupling transistor 634 to the second coupling transistor 634 to an "ON" state in order to properly bias the second amplifier circuitry 614. The memory cell 12 may be activated to generate a current. The generated current from the activated memory cell 12 may be transmitted to the input node ($V_{in}$) of the first amplifier circuitry 602 via a corresponding bit line (CN) 30. In an exemplary embodiment, when a logic low (e.g., binary "0" data state) is stored in the activated memory cell 12, no voltage potential and/or current may be transmitted to the input node ($V_{in}$) of the first amplifier circuitry 602, the predetermined voltage potential (e.g., DC operating voltage potential) and/or current at the output node ($V_{out}$) of the first amplifier circuitry 602 may remain the same. The predetermined voltage potential (e.g., DC operating voltage potential) and/or current at the output node (SAOUT) of the second amplifier circuitry 614 may also remain the same. The voltage potential at the output node (SAOUTB) of the inverter circuitry 626 may remain constant and the input/output circuitry 628 may output a logic low (e.g., binary "0" data state) is stored in the activated memory cell 12.

In another exemplary embodiment, when a logic high (e.g., binary "1" data state) is stored in the activated memory cell 12, a predetermined voltage potential and/or current may be transmitted to the input node ($V_{in}$) of the first amplifier circuitry 602, the predetermined voltage potential (e.g., DC operating voltage potential) and/or current at the output node ($V_{out}$) of the first amplifier circuitry 602 may increase due to the voltage potential and/or current generated by the activated memory cell 12. The increase of voltage potential and/or current at the output node ($V_{out}$) of the first amplifier circuitry 602 may cause a lowering of the predetermined voltage potential (e.g., DC operating voltage potential) and/or current at the output node (SAOUT) of the second amplifier circuitry 614. The voltage potential at the output node (SAOUTB) of the inverter circuitry 626 may vary (e.g., an increase in the voltage potential at the output node (SAOUTB)) and the input/output circuitry 628 may output a logic high (e.g., binary "1" data state) is stored in the activated memory cell 12.

Techniques for sensing a semiconductor memory device are disclosed. In one particular exemplary embodiment, the techniques may be realized as a semiconductor memory device comprising a plurality of memory cells arranged in an array of rows and columns and data sense amplifier circuitry coupled to at least one of the plurality of memory cells. The data sense amplifier circuitry may comprise first amplifier circuitry and resistive circuitry, wherein the first amplifier circuitry and the resistive circuitry may form a feedback loop.

In accordance with other aspects of this particular exemplary embodiment, the first amplifier circuitry may comprise a first power transistor and a first switching transistor.

In accordance with further aspects of this particular exemplary embodiment, the first power transistor and the first switching transistor may be arranged in a series configuration.

In accordance with additional aspects of this particular exemplary embodiment, the first power transistor may be coupled to a power source.

In accordance with yet another aspect of this particular exemplary embodiment, the resistive circuitry may comprise a first resistive transistor.

In accordance with other aspects of this particular exemplary embodiment, the first resistive transistor may be coupled to an input node of the first amplifier circuitry and an output node of the first amplifier circuitry.

In accordance with further aspects of this particular exemplary embodiment, a gate region of the first resistive transistor may be coupled to the output node of the first amplifier circuitry.

In accordance with additional aspects of this particular exemplary embodiment, the resistive circuitry may further comprise a second resistive transistor.

In accordance with yet another aspect of this particular exemplary embodiment, the second resistive transistor may be coupled to the first resistive transistor, an output node of the first amplifier circuitry, and an output node of a second amplifier circuitry.

In accordance with other aspects of this particular exemplary embodiment, a gate region of the second resistive transistor may be coupled to the output node of the second amplifier circuitry.

In accordance with further aspects of this particular exemplary embodiment, the data sense amplifier circuitry may further comprises second amplifier circuitry.

In accordance with additional aspects of this particular exemplary embodiment, the second amplifier circuitry may comprise a second power transistor and a second switching transistor.

In accordance with yet another aspect of this particular exemplary embodiment, the second power transistor and the second switching transistor may be arranged in a series configuration.

In accordance with other aspects of this particular exemplary embodiment, the second power transistor may be coupled to a second power source.

In accordance with further aspects of this particular exemplary embodiment, an input node of the second amplifier circuitry may be coupled to an output node of the first amplifier circuitry.

In accordance with additional aspects of this particular exemplary embodiment, the resistive circuitry may further comprise a second resistive transistor.

In accordance with yet another aspect of this particular exemplary embodiment, the data sense amplifier circuitry may further comprise pre-charge circuitry.

In accordance with other aspects of this particular exemplary embodiment, the pre-charge circuitry may be coupled to an output node of the first amplifier circuitry.

In accordance with further aspects of this particular exemplary embodiment, the data sense amplifier circuitry may further comprises inverter circuitry.

In accordance with additional aspects of this particular exemplary embodiment, the data sense amplifier circuitry may further comprise input/output circuitry.

At this point it should be noted that providing techniques for sensing a semiconductor memory device in accordance with the present disclosure as described above may involve the processing of input data and the generation of output data to some extent. This input data processing and output data generation may be implemented in hardware or software. For example, specific electronic components may be employed in a semiconductor memory device or similar or related circuitry for implementing the functions associated with sensing a semiconductor memory device in accordance with the present disclosure as described above. Alternatively, one or more processors operating in accordance with instructions may implement the functions associated with sensing a semiconductor memory device in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A semiconductor memory device comprising:
a plurality of memory cells arranged in an array of rows and columns; and
data sense amplifier circuitry coupled to at least one of the plurality of memory cells, the data sense amplifier circuitry comprising:
first amplifier circuitry comprising a first power transistor and a first switching transistor each coupled to a respective control signal line for controlling a state of the first power transistor and the first switching transistor; and
resistive circuitry, wherein the first amplifier circuitry and the resistive circuitry form a feedback loop.

2. The semiconductor memory device according to claim 1, wherein the first power transistor and the first switching transistor are arranged in a series configuration.

3. The semiconductor memory device according to claim 1, wherein the first power transistor is coupled to a power source.

4. The semiconductor memory device according to claim 1, wherein the resistive circuitry comprises a first resistive transistor.

5. The semiconductor memory device according to claim 4, wherein the first resistive transistor is coupled to an input node of the first amplifier circuitry and an output node of the first amplifier circuitry.

6. The semiconductor memory device according to claim 5, wherein a gate region of the first resistive transistor is coupled to the output node of the first amplifier circuitry.

7. The semiconductor memory device according to claim 4, wherein the resistive circuitry further comprises a second resistive transistor.

8. The semiconductor memory device according to claim 7, wherein the second resistive transistor is coupled to the first resistive transistor, an output node of the first amplifier circuitry, and an output node of a second amplifier circuitry.

9. The semiconductor memory device according to claim 8, wherein a gate region of the second resistive transistor is coupled to the output node of the second amplifier circuitry.

10. The semiconductor memory device according to claim 1, wherein the data sense amplifier circuitry further comprises second amplifier circuitry.

11. The semiconductor memory device according to claim 10, wherein the second amplifier circuitry comprises a second power transistor and a second switching transistor.

12. The semiconductor memory device according to claim 11, wherein the second power transistor and the second switching transistor are arranged in a series configuration.

13. The semiconductor memory device according to claim 11, wherein the second power transistor is coupled to a second power source.

14. The semiconductor memory device according to claim 10, wherein an input node of the second amplifier circuitry is coupled to an output node of the first amplifier circuitry.

15. The semiconductor memory device according to claim 1, wherein the resistive circuitry further comprises a second resistive transistor.

16. The semiconductor memory device according to claim 1, wherein the data sense amplifier circuitry further comprises pre-charge circuitry.

17. The semiconductor memory device according to claim 16, wherein the pre-charge circuitry is coupled to an output node of the first amplifier circuitry.

18. The semiconductor memory device according to claim 1, wherein the data sense amplifier circuitry further comprises inverter circuitry.

19. The semiconductor memory device according to claim 1, wherein the data sense amplifier circuitry further comprises input/output circuitry.

* * * * *